(12) United States Patent
Grand et al.

(10) Patent No.: US 8,883,547 B2
(45) Date of Patent: Nov. 11, 2014

(54) PRODUCTION OF THIN FILMS HAVING PHOTOVOLTAIC PROPERTIES, COMPRISING DEPOSITING AN ALTERNATE I/III OR III/I MULTI-LAYER STRUCTURE AND ANNEALING SAID STRUCTURE

(75) Inventors: Pierre-Philippe Grand, Rousset (FR); Salvador Jaime, Rousset (FR); Cedric Broussillou, Rousset (FR)

(73) Assignee: NEXCIS, Rousset (FR)

( * ) Notice: Subject to any disclaimer, the term of this patent is extended or adjusted under 35 U.S.C. 154(b) by 246 days.

(21) Appl. No.: 13/500,183

(22) PCT Filed: Oct. 6, 2010

(86) PCT No.: PCT/FR2010/052105
§ 371 (c)(1),
(2), (4) Date: Jun. 22, 2012

(87) PCT Pub. No.: WO2011/042660
PCT Pub. Date: Apr. 14, 2011

(65) Prior Publication Data
US 2012/0264255 A1    Oct. 18, 2012

(30) Foreign Application Priority Data
Oct. 7, 2009   (FR) ...................................... 09 56996

(51) Int. Cl.
*H01L 21/00*    (2006.01)
*H01L 31/18*    (2006.01)
*H01L 31/032*   (2006.01)

(52) U.S. Cl.
CPC ............ *H01L 31/0322* (2013.01); *H01L 31/18* (2013.01); *Y02E 10/541* (2013.01)
USPC ...................................... 438/84; 257/E31.008

(58) Field of Classification Search
CPC ........................................................ H01L 31/18
USPC ...................................... 438/84; 257/E31.008
See application file for complete search history.

(56) References Cited

U.S. PATENT DOCUMENTS

| 4,581,108 | A | * | 4/1986  | Kapur et al.    | 205/170   |
|-----------|---|---|---------|-----------------|-----------|
| 4,611,091 | A | * | 9/1986  | Choudary et al. | 136/260   |
| 4,638,111 | A | * | 1/1987  | Gay             | 136/249   |
| 4,798,660 | A | * | 1/1989  | Ermer et al.    | 204/192.17|
| 5,028,274 | A | * | 7/1991  | Basol et al.    | 136/264   |
| 5,286,306 | A | * | 2/1994  | Menezes         | 136/249   |
| 5,445,847 | A | * | 8/1995  | Wada et al.     | 427/74    |
| 5,474,939 | A | * | 12/1995 | Pollock et al.  | 438/85    |
| 5,477,088 | A | * | 12/1995 | Rockett et al.  | 257/764   |

(Continued)

OTHER PUBLICATIONS

International Search Report dated Apr. 5, 2012 for Application No. PCT/FR2010/052105.

*Primary Examiner* — Caleb Henry
(74) *Attorney, Agent, or Firm* — Frost Brown Todd LLC

(57) ABSTRACT

The invention relates to the production of a thin film having photovoltaic properties, containing a I-III-VI$_2$-type alloy and deposited by electrolysis, including the following steps: (a) successive deposits of layers of metallic elements I and III; and (b) thermal post-treatment with the addition of element VI. In particular, step (a) comprises the following operations: (a1) depositing a multi-layer structure comprising at least two layers of element I and two layers of element III, deposited in an alternate manner, and (a2) annealing said structure before adding element VI in order to obtain a I-III alloy.

15 Claims, 3 Drawing Sheets

(56) References Cited

U.S. PATENT DOCUMENTS

Figure 1:
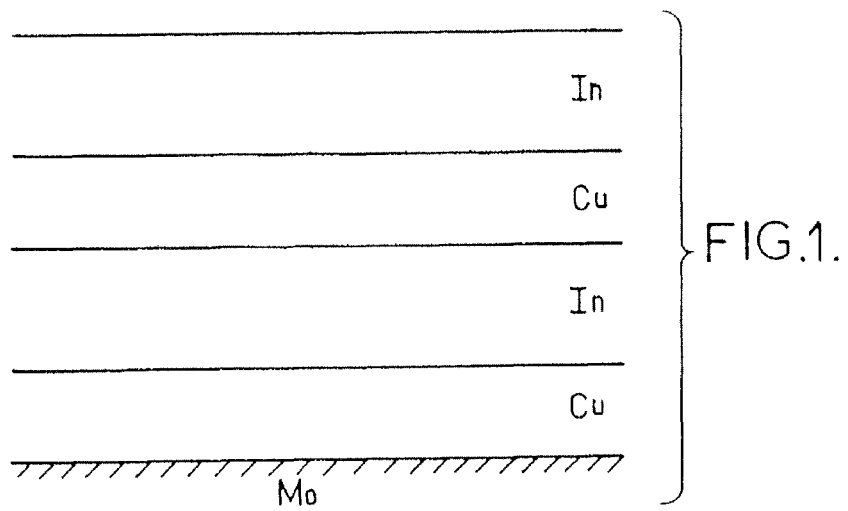

| | | | |
|---|---|---|---|
| 6,092,669 A * | 7/2000 | Kushiya et al. | 204/298.13 |
| 6,107,562 A * | 8/2000 | Hashimoto et al. | 136/252 |
| 6,121,541 A * | 9/2000 | Arya | 136/255 |
| 6,258,620 B1 * | 7/2001 | Morel et al. | 438/57 |
| 6,323,417 B1 * | 11/2001 | Gillespie et al. | 136/262 |
| 6,368,892 B1 * | 4/2002 | Arya | 438/96 |
| 6,515,219 B2 * | 2/2003 | Kondo | 136/256 |
| 7,026,258 B2 * | 4/2006 | Taunier et al. | 438/795 |
| 7,273,539 B2 * | 9/2007 | Taunier et al. | 205/238 |
| 7,776,203 B2 * | 8/2010 | Taunier et al. | 205/557 |
| 7,777,127 B2 * | 8/2010 | Chen | 136/252 |
| 8,067,263 B2 * | 11/2011 | Wieting | 438/96 |
| 8,071,421 B2 * | 12/2011 | Wieting | 438/96 |
| 8,076,176 B2 * | 12/2011 | Wieting | 438/96 |
| 8,084,291 B2 * | 12/2011 | Wieting | 438/96 |
| 8,088,640 B2 * | 1/2012 | Wieting | 438/96 |
| 8,323,735 B2 * | 12/2012 | Basol | 427/255.26 |
| 8,344,243 B2 * | 1/2013 | Lee | 136/256 |
| 8,394,662 B1 * | 3/2013 | Lee | 438/85 |
| 2005/0074915 A1 * | 4/2005 | Tuttle et al. | 438/57 |
| 2005/0109392 A1 * | 5/2005 | Hollars | 136/265 |
| 2005/0194036 A1 * | 9/2005 | Basol | 136/252 |
| 2005/0202589 A1 * | 9/2005 | Basol | 438/102 |
| 2005/0215079 A1 * | 9/2005 | Taunier et al. | 438/796 |
| 2006/0084196 A1 * | 4/2006 | Taunier et al. | 438/102 |
| 2006/0121701 A1 * | 6/2006 | Basol | 438/483 |
| 2006/0151331 A1 * | 7/2006 | Taunier et al. | 205/316 |
| 2007/0089782 A1 | 4/2007 | Scheuten et al. | |
| 2007/0093006 A1 * | 4/2007 | Basol | 438/150 |
| 2007/0227633 A1 * | 10/2007 | Basol | 148/518 |
| 2007/0289624 A1 * | 12/2007 | Kuriyagawa et al. | 136/262 |
| 2008/0023336 A1 * | 1/2008 | Basol | 205/182 |
| 2008/0057616 A1 * | 3/2008 | Robinson et al. | 438/95 |
| 2008/0092954 A1 * | 4/2008 | Choi | 136/262 |
| 2008/0093221 A1 * | 4/2008 | Basol | 205/170 |
| 2008/0110495 A1 * | 5/2008 | Onodera et al. | 136/256 |
| 2008/0190761 A1 * | 8/2008 | Basol | 204/227 |
| 2008/0280030 A1 * | 11/2008 | Van Duren et al. | 427/74 |
| 2009/0035882 A1 * | 2/2009 | Basol | 438/16 |
| 2009/0117684 A1 * | 5/2009 | Basol | 438/95 |
| 2009/0235987 A1 * | 9/2009 | Akhtar et al. | 136/262 |
| 2009/0250722 A1 * | 10/2009 | Bruce et al. | 257/184 |
| 2010/0081230 A1 * | 4/2010 | Lee | 438/95 |
| 2010/0087016 A1 * | 4/2010 | Britt et al. | 438/7 |
| 2010/0133093 A1 * | 6/2010 | MacKie et al. | 204/192.25 |
| 2011/0018103 A1 * | 1/2011 | Wieting | 257/613 |

* cited by examiner

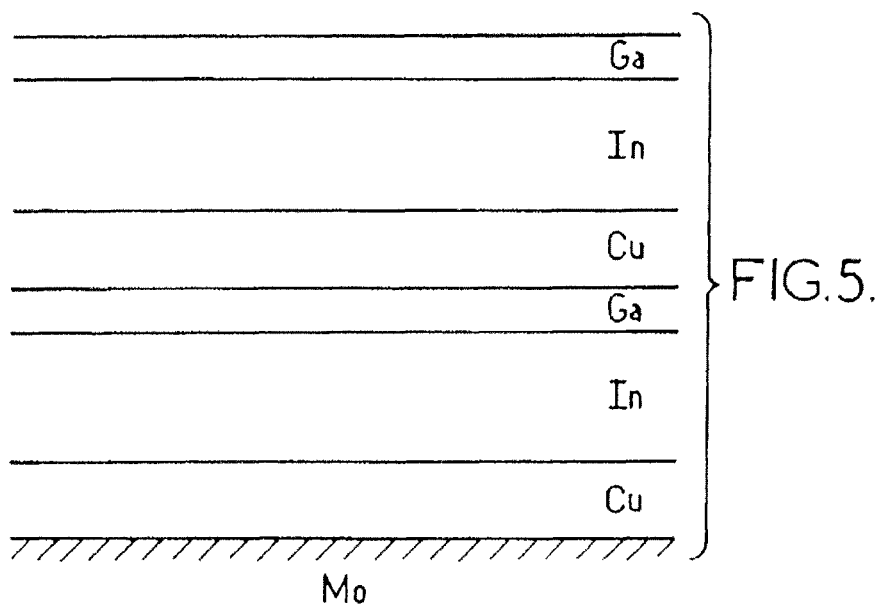
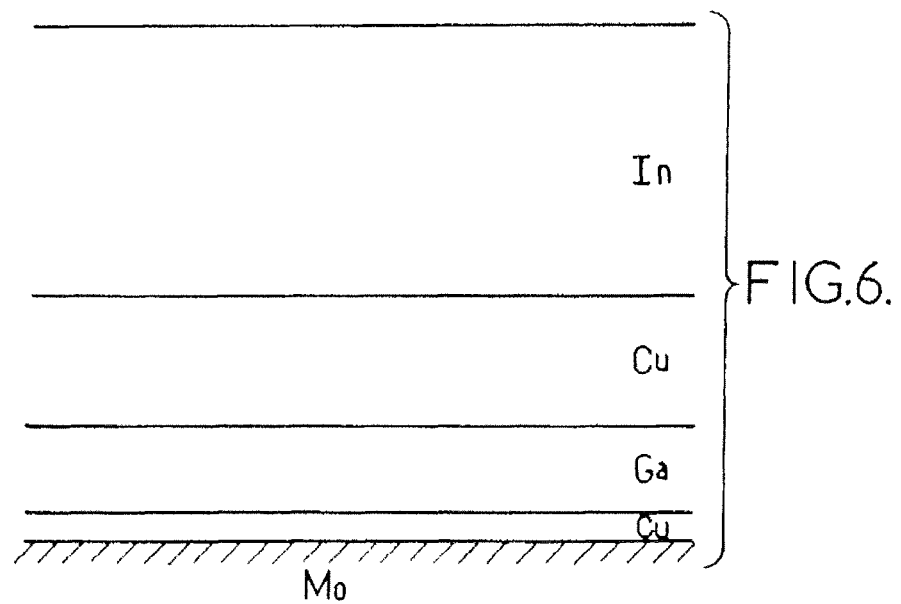

PRODUCTION OF THIN FILMS HAVING PHOTOVOLTAIC PROPERTIES, COMPRISING DEPOSITING AN ALTERNATE I/III OR III/I MULTI-LAYER STRUCTURE AND ANNEALING SAID STRUCTURE

TECHNICAL BACKGROUND AND PROBLEM

The invention relates to the production of photovoltaic cells, particularly for converting solar energy into electricity. Such cells often have a structure that is a stack of thin films, with at least one of these thin films having photovoltaic properties. The invention relates in particular to preparing and obtaining this photovoltaic film, referred to below as the "absorber".

The absorber is prepared here by electrodeposition. It is based on an alloy formed of elements of group I (such as copper), III (such as indium and/or gallium and/or aluminum), and VI (such as sulfur and/or selenium). Such an alloy, having an overall stoichiometry of close to I-III-VI$_2$, is known to offer good photovoltaic properties.

In the technique of the present application, a solid I-III alloy is first formed by electrodeposition and element VI is then added by annealing in an atmosphere rich in element VI. In practice, two electrodes with a voltage differential applied to them are immersed in an electrolysis bath containing appropriate salts (for example compounds based on copper, indium or gallium as will be further discussed below), and the deposit is formed on one of the electrodes.

However, often the I-III alloy has local compositional inhomogeneities relative to the deposition in general, as well as irregularities in shape (cavities, interface irregularities, etc.). In addition, these defects remain present in the final layer after the element VI is added and the photovoltaic conversion efficiency is affected.

The invention improves the situation.

GENERAL DESCRIPTION OF THE INVENTION

The invention therefore proposes creating a multilayer structure comprising at least one stack of films of elements I/III/I/III and annealing this structure before element VI is added.

The invention thus relates to a method for producing a thin film with photovoltaic properties, particularly for solar cell applications, based on a I-III-VI$_2$ alloy and deposited by electrolysis, said method comprising at least the following steps:
a) successive deposits of layers of metal elements I and III,
b) and thermal post-treatment with the addition of element VI.

In the sense of the invention, step a) comprises the following operations:
a1) depositing a multilayer structure comprising at least:
two layers of element I and
two layers of element III
alternately deposited (therefore in a stack of element layers I/III/I/III or III/I/III/I, and
a2) annealing this structure before adding element VI to obtain a I-III alloy.

It has been observed that, in a particularly advantageous manner, a multilayer structure of at least two sequences of alternating I/III (or III/I) maintains good adhesion properties without requiring an intermediate annealing.

In particular, the total thickness of the multilayer structure can be chosen to limit the detachment phenomena linked to the differences in mechanical behavior of the successive layers. In the tests conducted, the total thickness of the final structure may be for example between 1 and 3 μm after element VI is added.

It has been observed that a factor in the improved cohesion of the multilayer structure, with no annealing required, could be related to different deposition conditions for layers of a same element in the multilayer structure. Thus the method in the sense of the invention preferably comprises dissimilar deposition conditions for at least two layers of a same element. In particular, it is advantageous for the second layer of element I to be deposited at a higher electrode potential, as an absolute value, than the deposition potential of the first layer of element I, In the exemplary embodiments proposed below with copper as element I, the deposition potential of the first layer deposited (close to the substrate) is −1V relative to a reference electrode, while the second layer of copper as the element can be deposited at a potential of −1.3V.

The respective thicknesses of the layers deposited in operation a1) can be a function of the chosen proportions of elements I and III in the I-III alloy.

For the preferred proportions of element I and element III in the I-III alloy of operation a2), if the thin film to be obtained is based on a CuIn(S,Se)$_2$ alloy, the multilayer structure of operation a1) preferably has an atomic ratio of between 1.2 and 2.0.

If the thin film to be obtained is based on a Cu(In,Ga)(S, Se)$_2$ alloy, the multilayer structure of operation a1) preferably comprises:
an atomic ratio for the Cu/(In+Ga) of between 0.8 and 1.0, and
an atomic ratio for the Ga/(In+Ga) of between 0.1 and 0.4.
In an advantageous multilayer structure, at least one of the layers of element III in the structure comprises at least two sub-layers of dissimilar element III. For example, one possible multilayer structure can be Cu/In/Ga/Cu/In/Ga.

As was stated before, the atomic ratio between two elements A and B, denoted a/b, is deduced from the respective thicknesses of the layers of element A and element B, as follows:

$$a/b = \frac{\left(\frac{DA.EA}{RA}\right)}{\left(\frac{DB.EB}{RB}\right)},$$

where:
EA and EB are respective thicknesses of the layers of element A and element B,
DA and DB are their respective densities, and
RA and RB are their respective molar masses.

Even so, the relative thicknesses of the layers of elements I and III in the multilayer structure of operation a1) can also be chosen as a function of the conditions of the heat treatment and/or of the addition of element VI. For example, if the heat treatment occurs at a temperature greater than 156° C., corresponding to the melting point of indium as element III, some indium may escape. It is, however, possible to compensate for this escape of indium by providing thicker layers of indium, thus contributing more indium to the overall stoichiometry of the multilayer structure, which for example allows an accelerated heat treatment at a temperature greater than 156° C.

The relative thicknesses of the layers of elements I and III in the multilayer structure may also be chosen as a function of the desired degree of intermixing between elements I and III in the I-III alloy of operation a2). Typically, the thinner the layers of the multilayer structure, the higher the degree of intermixing. Of course, the degree of intermixing further depends on the heat treatment conditions for obtaining the I-III alloy, but also for obtaining the final ternary I-III-VI$_2$ alloy (after element VI is added). Preferred heat treatment characteristics are given below as an example.

Operation a2) preferably comprises an increase to an alloying temperature of between 100 and 250° C. for a period of between 5 and 120 minutes. It may be followed by a return to room temperature during a period of between 20 and 180 seconds in order to quench the I-III alloy before adding element VI. As a variant, the I-III alloy is maintained at alloying temperature before element VI is added.

The addition of element VI may also involve a second heat treatment, preferably in an atmosphere of element VI with a temperature increase to between 450 and 600° C., then maintaining it at this temperature for a period of between 30 and 600 seconds. The rate of the temperature increase can be between 3.5° C./s and 20° C./s. This type of heat treatment is particularly good for adding sulfur as element VI in the thin film based on the ternary I-III-VI$_2$ alloy. In such an embodiment, the sulfur is added in a mixture of argon and/or nitrogen and sulfur vapor, at a controlled pressure of between 10 and 1200 mbar.

In one variant, the addition of element VI may comprise:
a condensation of vapors containing element VI at a temperature of the I-III alloy of less than 100° C.,
followed by a temperature increase to between 150 and 250° C. for 30 seconds to 15 minutes,
followed by a temperature increase to 450 to 550° C. for 30 seconds to 15 minutes.

This type of treatment is particularly suitable for adding selenium as element VI. Although this element VI addition treatment is advantageous in the case of a multilayer structure in the sense of the invention, it could also be appropriate for any other type of initial thin film (for example an initial I/III or III/I structure, before annealing, or an initial layer of directly electrodeposited I-III alloy). Thus this treatment may be separate protection, independent of the type of previously electrodeposited layers (I, III). Of course, this treatment can be continued by sulfurization per the second heat treatment described above, to obtain a ternary I-III-(S,Se)$_2$ alloy including both selenium and sulfur as element VI.

It may be advantageous for the multilayer structure to commence with a layer of element I (such as copper) in contact with a substrate (often of molybdenum) or in contact with an adaptation layer (of ruthenium for example as described below), onto which the multilayer structure is deposited. It is particularly advantageous if the multilayer structure terminates at the surface in a layer of element I, such as copper, to limit the possible evaporation of the element III, such as indium.

The invention also relates to a thin film with photovoltaic properties, based on a I-III-VI$_2$ alloy and obtained by the method of the invention. In particular, the film layer may comprise an alternating variation in the alloy proportion of element I and element III. One can observe, by X-ray diffraction (XRD) for example, the presence of element I not combined with element III (for example copper alone) and the presence of a I-III alloy (in particular $Cu_{11}In_9$ in an example where copper is element I and indium is element III). As indicated above, a slight variation in the concentration of element I and element III may also be observed in the final layer, even though the thermal annealing has the purpose of decreasing this variation as much as possible. One means of observing such a variation can consist of measurement using SIMS spectroscopy (Secondary Ion Mass Spectroscopy) for example.

The invention also relates to the method for producing a solar cell, comprising the steps of the method in the sense of the invention for producing a thin film with photovoltaic properties as absorber. The method can then continue with the deposition of a covering layer acting as a transparent optical window, then doped layers, etc. The invention also relates to a solar cell comprising an active layer in the sense of the invention.

Advantages of the Invention

The advantage of depositing a succession of layers of elements I/III/I/III, followed by annealing at a carefully selected temperature, is apparent in the improved intermixing (or interdiffusion) of the elements I and III before element VI is added (by sulfurization and/or selenization, as will be seen below). Considering the diffusion length of element III and/or element I (such as indium, copper, and/or gallium), the annealing temperature is optimally chosen as a function of the thicknesses of the element layers.

Implementing such an embodiment provides control of a mechanical effect. Stacking thin films redistributes the stresses in these layers to decrease the peel force and therefore to improve the adhesion of the layers on the substrate during the heat treatment.

It can be seen that the thicknesses of the layers, as well as the duration and temperature of the annealing, before element VI is added, are optimized here to obtain results which have been found to be satisfactory, as described in the exemplary embodiments below.

Advantageously, the I/III/I/III stack is made by only one pass in an electrolysis bath and the annealing and the addition of element VI may also occur after only one pass in an appropriate oven or furnace. It is therefore unnecessary, in the sense of the invention, to provide intermediate annealing of I/III stacks, meaning:
depositing a I/III stack by electrolysis,
annealing this I/III stack,
reintroducing this I/III stack into an electrolysis bath in order to deposit a new I/III stack on top,
again annealing the entire I/III/I/III stack,
repeating these steps if necessary,
and performing selenization or sulfurization of the entire I/III stack obtained.

Such an embodiment is technically possibly, because the I-III alloy, like the element layers I and III, are metal and therefore conductors, and are therefore able to receive a covering deposited by electrolysis.

BRIEF PRESENTATION OF DRAWINGS

Figure 2:
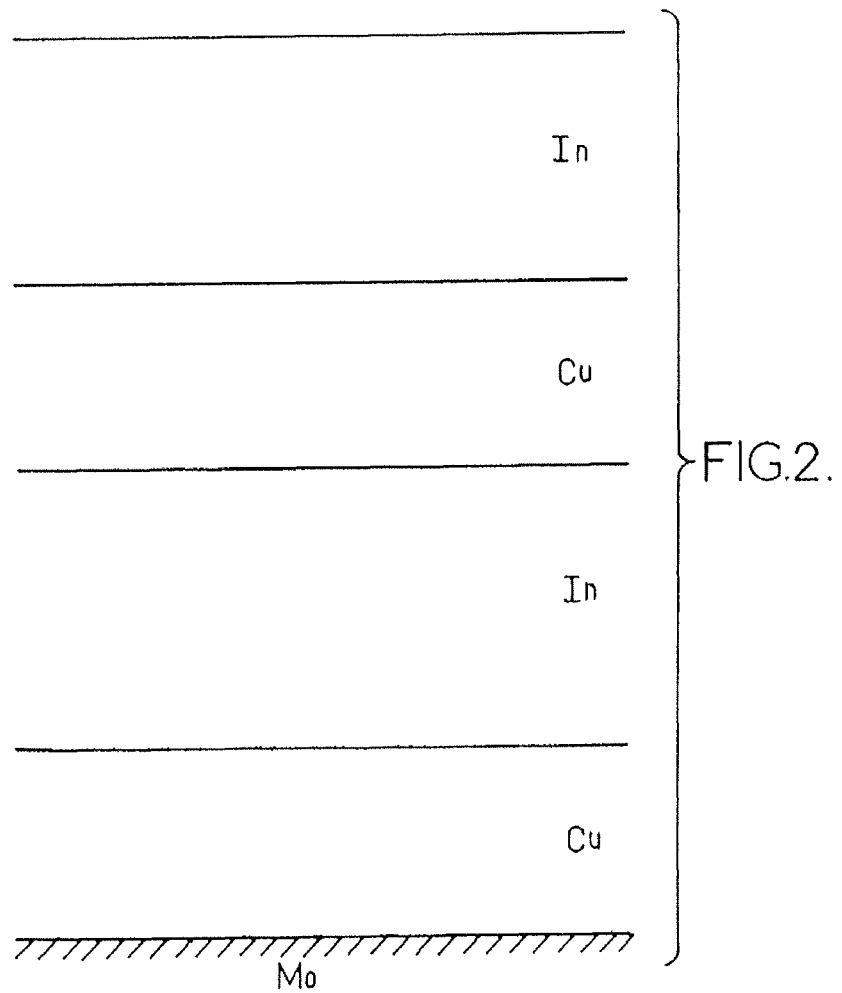
Figure 3:
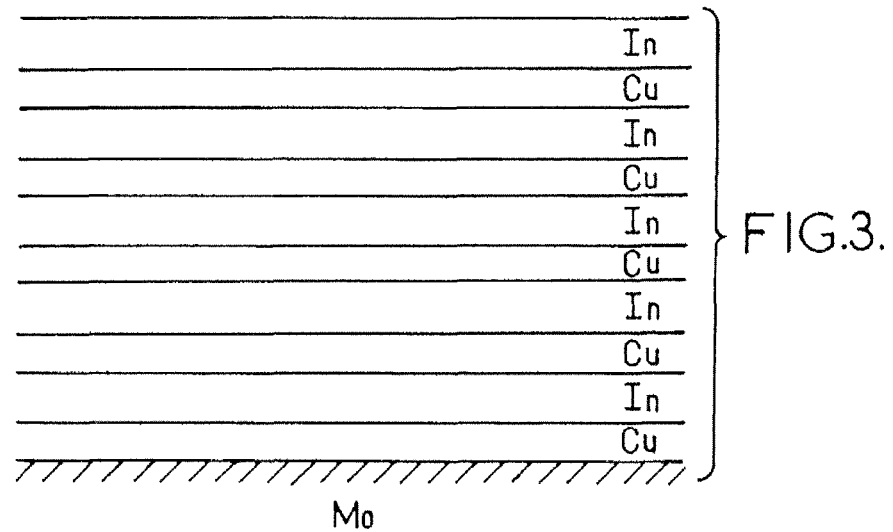
Figure 4:
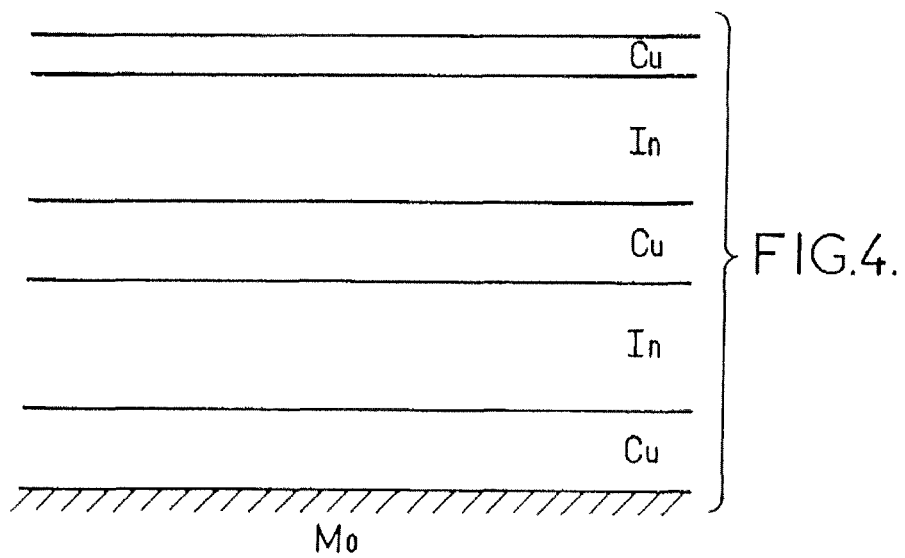

Other features and advantages of the invention will be apparent from examining the following detailed description and the attached scale drawings, in which:

FIG. 1 schematically represents a stack in a multilayer I/III/I/III structure in a first embodiment in which the layers of element I are 150 nm thick and contain copper and the layers of element III are 200 nm thick and contain indium, for a total thickness of 700 nm, FIG. 2 schematically represents a stack in a multilayer I/III/I/III structure in a second embodiment in which the layers of element I are 300 nm thick and contain copper and the layers of element III are 400 nm thick and contain indium, for a total thickness of 1400 nm, FIG. 3 schematically represents a stack in a multilayer I/III/I/III/I/III/I/III/I/III structure in a third embodiment in which the layers of element I are 60 nm thick and contain copper and the layers of element III are 80 nm thick and contain indium, for a total thickness of 700 nm, FIG. 4 schematically represents a stack corresponding to the one illustrated in FIG. 1 but in which the layers of copper are 120 nm thick and additionally contain a fifth layer of copper covering the stack and 60 nm thick, in a fourth embodiment, FIG. 5 schematically represents a stack in a fifth embodiment, of Cu (115 nm thick), In (200 nm thick), Ga (65 nm thick), Cu (115 nm thick), In (200 nm thick), Ga (65 nm thick), and FIG. 6 schematically represents a I/III/I/III stack in a sixth embodiment, of Cu (40 nm thick), Ga (130 nm thick), Cu (190 nm thick), In (400 nm thick).

DESCRIPTION OF EMBODIMENTS

A more detailed description of the production of solar cells is provided below, in which the absorber is synthesized by:
  Sequential electrodeposition (ED) in multilayers, in this case copper (Cu), indium (In), and possibly gallium (Ga), then
  Transformation into a p-type semiconductor by adding element VI (sulfurization or selenization) during heat treatment.

The creation of cells based on such a stack, to form the $CuInS_2$ (CIS) or $CuInGaSe_2$ (CIGSe) alloy according to this method, provides photovoltaic conversion efficiencies exceeding 8%. These sequential multilayer deposits encourage the interdiffusion of Cu—In, Cu—Ga and/or Cu—In—Ga.

To produce the complete cell, one often proceeds as follows:
  on a substrate of soda-lime glass (1-3 mm thick or a sheet of metal, preferably 430 stainless steel and 50-500 μm thick), a layer of molybdenum Mo 400-1000 nm thick and preferably 500 nm thick is deposited by cathode sputtering (sheet resistance of between 0.1-0.4Ω);
  in the case of a metal sheet, a barrier layer of oxide ($SiO_x$, $Al_2O_3$, $AlSiO_x$, sintered glass) or of chromium Cr, 20-3000 nm thick depending on the material used, is added;
  a layer of ruthenium-tantalum is possibly also added by sputtering (2-20 nm thick) in order to improve the adhesion of the future copper layer onto the molybdenum;
  then the metal alloy Cu—In or Cu—In—Ga is deposited, as will be seen below, by successive electrodeposition of layers of Cu, In (and possibly Ga). This step also allows incorporating a certain amount of sodium into the layer;
  then possibly, to adjust the level of sodium in the absorber, a layer of NaF is deposited by evaporation or sputtering (5-150 nm thick); and
  heat treatment is performed to form the alloy ad hoc, followed by another annealing in an atmosphere of sulfur and/or selenium to add element VI.

The layers formed by electrodeposition of Cu and In must allow obtaining an atomic ratio of Cu/In of between 1.2 and 2.0, preferably 1.65. The layers formed by electrodeposition of Cu, In and Ga must allow obtaining an atomic ratio of between 0.8 and 1.0, preferably 0.9, for Cu/(In+Ga), and between 0.1 and 0.4, preferably 0.3, for Ga/(In+Ga).

The optimum thicknesses of the element layers in the stack for each of the six embodiments described below are represented in FIGS. 1 to 6 (relative scale).

After successive multilayer deposition of Cu and In (and possibly Ga), to form the CIS compound (CISe or CIGSe or CIGS or CIGSSe) of chalcopyrite crystal structure, a heat treatment in at least two parts is used. If the layers deposited by electrolysis are Cu and In, the first part of the heat treatment forms the $Cu_{11}In_9$ alloy from the copper and the metastable alloy $CuIn_2$. If the layers deposited by electrolysis are Cu, In and Ga, the first part of the heat treatment forms the $Cu_xIn_yGa_z$ alloy (with x, y and z such that the alloy proportion varies from $Cu_{11}In_9$ to $CuGa_2$).

The first part of the heat treatment is done under controlled pressure, in an inert atmosphere of nitrogen or argon to prevent oxidation of the metal layers of copper and indium. Once the alloying heat treatment is completed, the stack may:
  be returned to room temperature during a period of between 20 and 180 seconds (preferably between 20 and 60 seconds, for example 45 seconds) in order to quench the $Cu_{11}In_9$ or $Cu_xIn_yGa_z$ alloy and maintain this structure for the next step,
  or be held at the alloying temperature and transferred to the sulfurization chamber.

This alloy then undergoes a second heat treatment step in an atmosphere containing sulfur or selenium to allow the reaction and formation of the chalcopyrite structure CIS, CISe, CIGSe, CIGS or CIGSSe. The sulfur or selenium can be introduced (before or during the heat treatment) in solid form S or Se (powder, pellet, CBD on the sample), in liquid form as spray, or gas ($H_2S$, $H_2Se$, vaporized elemental selenium or sulfur).

These two steps can be done separately with a return to room temperature in between, or sequentially in order to optimize the energy efficiency of the annealing.

After chemical stripping in a bath of KCN (01-2.5M), a layer of CdS (30-100 nm thick, preferably 50 nm) or ZnS (10-50 nm thick, preferably 20 nm) is deposited chemically. If this previous layer is CdS, a layer of iZnO (30-150 nm thick, preferably 80 nm) is deposited by sputtering. If the previous layer is ZnS, a layer of ZnMgO (30-150 nm thick, preferably 90 nm) is deposited by sputtering. Then a layer of Al-doped ZnO (300-1500 nm thick, preferably 500 nm) is deposited by sputtering. After discretization or deposition of a collector grid, a photovoltaic cell is obtained for which the conversion efficiency can then be measured.

First Embodiment

A layer of CIS can be formed on a glass (3 mm)/molybdenum (500 nm) or 430 stainless steel (127 μm)/$SiO_x$ (1000 nm)/molybdenum (500 nm) substrate, by:
  1—depositing a 150 nm layer of copper by electrolysis in a bath which has the following concentrations: $CuSO_4$ (0.075 mol/l) and trisodium citrate (0.250 mol/l or "M" for 'mol/l'). The layers are deposited by cathode reaction with an imposed potential of −1.1 Volt (V) relative to the reference electrode (in mercurous sulfate). The current density is −1.5 mA/cm². The bath temperature is 20-25° C. (room temperature) and the bath is stirred.
  2—depositing a 200 nm layer of Indium by electrolysis in a bath which has the following concentrations: $In_2(SO_4)_3$ (0.044 M) and sodium sulfate (0.493 M). The layers are deposited by cathode reaction with an imposed intensity of −0.5 mA/cm². The deposition potential is then between −1.05 and −1.09 V/MSE. The bath temperature is 20-25° C. (room temperature) and the bath is stirred.
  3—repeating operation 1 while modifying the imposed potential to −1.3V. The current density is −2.5 mA/cm².
  4—repeating operation 2. The atomic ratio of Cu/In is then close to 1.65, with a slight excess of copper relative to this ratio.

FIG. 1 schematically illustrates the stack obtained before the heat treatment.

5—a heat treatment for the purpose of forming the $Cu_{11}In_9$ compound is performed at a temperature of between 100 and 250° C., preferably between 120° C. and 200° C. (for example 155° C.), for a period of between 5 and 120 min (for example 30 min) depending on the desired degree of interdiffusion. This heat treatment is done under controlled pressure, in an inert atmosphere of nitrogen or argon to prevent oxidation of the metal layers of copper and indium. Once the heat treatment of the alloy is completed, the stack is returned to room temperature during a period of between 20 and 180 s, preferably between 20 and 60 s (for example 45 s) in order to quench the $Cu_{11}In_9$ alloy and maintain this structure for the next step.

6—The second annealing step consists of increasing the temperature of the mixture of the $Cu_{11}In_9$ alloy and the surplus copper metal to a maximum temperature of 450 to 600° C. (for example 500° C.) then maintaining it at this temperature for a period of 30 to 600 seconds, preferably 90 to 180 s (for example 120 s). The rate of the temperature increases is between 3.5° C./s and 20° C./s, preferably between 7° C./s and 12° C./s (for example 8° C./s). This treatment is done in a sulfurous atmosphere of a mixture of argon or nitrogen and sulfur vapor, at a controlled pressure which can be between 10 and 1200 mbar (for example 1100 mbar). The sulfur is introduced near the sample and in powder form, prior to increasing the temperature in the chamber. The amount of sulfur used is between 1 and 10 times the stoichiometry. Once the high temperature treatment is completed, the absorber is returned to room temperature but must be kept in an inert atmosphere until the temperature is below 150° C. After sulfurization, the material consists of a layer of $CuInS_2$ of chalcopyrite structure and a non-continuous surface layer of $Cu_xS_y$ binaries.

7—Chemical stripping in a bath of KCN (1M) at 25° C. for 5 min.

8—Forming a 50 nm layer of CdS by chemical bath deposition at $T_f=65°$ C. in a bath comprising: $[Cd(Ac)_2]=1.4\times10^{-3}$ M, $[SC(NH_2)_2]=0.28$ M and $[NH_3]=1.5$ M.

9—Forming a 80 nm thick layer of iZnO then a 500 nm thick layer of Al-doped ZnO by sputtering.

Second Embodiment

A layer of CIS can be formed on a glass (3 mm)/molybdenum (500 nm) or 430 stainless steel (127 μm)/$SiO_x$ (1000 nm)/molybdenum (500 nm) substrate, by:

1—depositing a 300 nm layer of copper by electrolysis in a bath having the following concentrations: $CuSO_4$ (0.075 M) and trisodium citrate (0.250 M). The films are deposited by cathode reaction with an imposed potential of −1.1V relative to the reference electrode (with mercurous sulfate). The current density is −1.5 mA/cm².

2—depositing a 400 nm layer of Indium by electrolysis in a bath having the following concentrations: $In_2(SO_4)_3$ (0.044 M) and sodium sulfate (0.493 M). The films are deposited by cathode reaction with an imposed intensity of −0.5 mA/cm². The deposition potential is then $E\approx[-1.05;-1.09]$ V/MSE.

3—repeating operation 1 while modifying the imposed potential to −1.3V. The current density is −2.5 mA/cm².

4—repeating operation 2. The atomic ratio of Cu/In is then 1.65.

FIG. 2 schematically illustrates the stack obtained before heat treatment.

5—repeating operations 5 to 9 of the first embodiment

Third Embodiment

A layer of CIS can be formed on a glass (3 mm)/molybdenum (500 nm) or 430 stainless steel (127 μm)/$SiO_x$ (1000 nm)/molybdenum (500 nm) substrate, by:

1—depositing a 60 nm layer of copper by electrolysis in a bath having the following concentrations: $CuSO_4$ (0.075 M) and trisodium citrate (0.250 M). The films are deposited by cathode reaction with an imposed potential of −1.1V relative to the reference electrode (with mercurous sulfate). The current density is −1.5 mA/cm².

2—depositing a 80 nm layer of Indium by electrolysis in a bath having the following concentrations: $In_2(SO_4)_3$ (0.044 M) and sodium sulfate (0.493 M). The films are deposited by cathode reaction with an imposed intensity of −0.5 mA/cm². The deposition potential is then $E\approx[-1.05;-1.09]$ V/MSE.

3—repeating operation 1 while modifying the imposed potential to −1.3V. The current density is −2.5 mA/cm².

4—repeating operation 2.

5—repeating operations 3 and 4 until a total thickness of 300 nm is achieved for the Cu and 400 nm for the In.

FIG. 3 schematically illustrates the stack obtained before the heat treatment.

6—repeating operations 5 to 9 of the first embodiment.

Fourth Embodiment

A layer of CIS can be formed on a glass (3 mm)/molybdenum (500 nm) or 430 stainless steel (127 μm)/SiO, (1000 nm)/molybdenum (500 nm) substrate, by:

1—depositing a 120 nm layer of copper by electrolysis in a bath having the following concentrations: $CuSO_4$ (0.075 M) and trisodium citrate (0.250 M). The precursors are deposited by cathode reaction with an imposed potential of −1.1V relative to the reference electrode (with mercurous sulfate). The current density is −1.5 mA/cm².

2—depositing a 200 tun layer of Indium by electrolysis in a bath having the following concentrations: $In_2(SO_4)_3$ (0.044 M) and sodium sulfate (0.493 M). The precursors are deposited by cathode reaction with an imposed intensity of −0.5 mA/cm². The deposition potential is then $E\approx[-1.05;-1.09]$ V/MSE. The atomic ratio of Cu/In is then 1.65.

3—repeating operation 1 while modifying the imposed potential to −1.3V. The current density is −2.5 mA/cm².

4—repeating operation 2.

5—repeating operation 3 until a thickness of 60 nm is obtained for the Cu. The purpose of this superficial Cu layer is to prevent the evaporation of $In_xS_y$ during the sulfurization heat treatment, limiting the roughness of the alloy before sulfurization and improving the coverage of Cu,S binaries on the surface of the CIS.

FIG. 4 schematically illustrates the stack obtained before the heat treatment.

6—repeating operations 5 to 9 of the first embodiment.

Fifth Embodiment

A layer of CIS can be formed on a glass (3mm)/molybdenum (500 nm) or 430 stainless steel (127 μm)/$SiO_x$ (1000 nm)/molybdenum (500 nm) substrate, by:

1—depositing a 115 nm layer of Copper by electrolysis in a bath having the following concentrations: $CuSO_4$ (0.075 M) and trisodium citrate (0.250 M). The precursors are deposited by cathode reaction with an imposed potential of −1V relative to the reference electrode (with mercurous sulfate). The current density is −1 mA/cm².

2—depositing a 200 nm layer of Indium by electrolysis in a bath having the following concentrations: $In_2(SO_4)_3$ (0.044 M) and sodium sulfate (0.493 M). The precursors are deposited by cathode reaction with an imposed intensity of −0.5 mA/cm². The deposition potential is then E≈[−1.05;−1.09] V/MSE.

3—depositing a 65 nm layer of gallium by electrolysis in a bath having the following concentrations: $Ga_2(SO_4)_3$ (0.01 M), HCl (0.002 M), and sodium chloride (0.15 M). The bath temperature is 20-25° C. The films are deposited by cathode reaction with an imposed potential of −1.5V relative to the reference electrode (with mercurous sulfate). The current density is −2 mA/cm². Another bath solution for the gallium deposition has yielded good results, using the baths offered by ENTHONE® (reference Heliofab Ga365 RFU). The batch temperature is 60° C. and the bath is stirred. The current density applied is −40 mA/cm².

4—depositing a 115 nm layer of Copper by electrolysis in a bath having the following concentrations: $CuSO_4$ (0.075 M) and trisodium citrate (0.250 M). The precursors are deposited by cathode reaction with an imposed potential of −1.3V relative to the reference electrode (with mercurous sulfate). The current density is −2.5 mA/cm².

5—repeating operations 2 and 3 of this embodiment, one time.

6—applying a heat treatment for the purpose of forming a $Cu_xIn_yGa_z$ alloy, at a temperature of between 25 and 200° C., preferably between 25° C. and 100° C., for a period of between 1 and 30 min depending on the desired degree of interdiffusion.

FIG. 5 schematically illustrates the stack obtained before heat treatment.

7—depositing a layer of Selenium or condensing Se vapors on the "cold" sample, meaning at a temperature below 100° C., or using a gas containing selenium vapors. The temperature is increased to between 150 and 250° C. by 10° C./s, then maintained at temperature for 30 seconds to 15 minutes. Next the temperature is rapidly increased (10° C./s) to 450-550° C. in order to increase the size of the alloy particles. This temperature is maintained for 30 seconds to 15 minutes. It is possible to perform sulfurization with sulfured gas at a temperature of between 400 and 600° C. for 30 seconds to 15 minutes to obtain a pentenary compound of CuInGaSSe. Lastly, the temperature is lowered to less than 100° C. and preferably 60° C.

8—repeating operations 7 to 9 of the first embodiment.

Sixth Embodiment

A layer of CIG(S)Se can be formed on a glass (3 mm)/molybdenum (500 nm) or 430 stainless steel (127 μm)/$SiO_x$ (1000 nm)/molybdenum (500 nm) substrate, by:

1—depositing a 40 nm layer of copper by electrolysis in a bath having the following concentrations: $CuSO_4$ (0.075 M) and trisodium citrate (0.250 M). The precursors are deposited by cathode reaction with an imposed potential of −1.1V relative to the reference electrode (with mercurous sulfate). The current density is −1.5 mA/cm².

2—depositing a 130 nm layer of gallium by electrolysis in a bath having the following concentrations: $Ga_2(SO_4)_3$ (0.01 M), HCl (0.002 M), and sodium chloride (0.15 M). The bath temperature is 20-25° C. The films are deposited by cathode reaction with an imposed potential of −1.5V relative to the reference electrode (with mercurous sulfate). The current density is −2 mA/cm². The atomic ratio of Cu/Ga is then 0.5. The baths from ENTHONE® can be used as a variant, as indicated above.

3—depositing a 190 nm layer of Copper by electrolysis in a bath having the following concentrations: $CuSO_4$ (0.075 M) and trisodium citrate (0.250 M). The precursors are deposited by cathode reaction with an imposed potential of −1.3V relative to the reference electrode (with mercurous sulfate). The current density is −2.5 mA/cm².

4—depositing a 400 nm layer of Indium by electrolysis in a bath having the following concentrations: $In_2(SO_4)_3$ (0.044 M) and sodium sulfate (0.493 M). The precursors are deposited by cathode reaction with an imposed intensity of −0.5 mA/cm². The deposition potential is then E≈[−1.05;−1.09] V/MSE. The atomic ratio of Cu/(In+Ga) is then 0.9 and of Ga/(In+Ga) is 0.3.

FIG. 6 schematically illustrates the stack obtained before heat treatment.

5—a heat treatment for the purpose of forming a $Cu_xIn_yGa_z$ alloy is performed at a temperature of between 100 and 250° C., preferably between 120° C. and 200° C. (for example 155° C.), for a period of between 5 and 120 min (for example 30 min) depending on the desired degree of interdiffusion.

6—applying step 6 of the fifth embodiment.

7—repeating operations 7 to 9 of the first embodiment.

One can see that multiple exemplary embodiments can be considered for obtaining CIS, CISe, CIGS, CIGSe or CIGSSe. One satisfactory embodiment for obtaining a thin film of CIS 2 μm thick consists of depositing, under the conditions of the first to fourth embodiments above: 235 nm copper, 325 nm indium, 235 nm copper, and 325 nm indium, to achieve a stack of about 1120 nm of Cu/In/Cu/In, then to perform a heat treatment and add element VI (sulfur for example). One will note that the layer increases from a thickness of about 1120 nm before sulfurization to a thickness of 2 μm after sulfurization.

The invention claimed is:

1. Method for producing a thin film having photovoltaic properties, based on a I-III-$VI_2$ alloy and deposited by electrolysis, said method comprising at least the steps of:
 a) successively depositing layers of metal elements I and III,
 b) and applying a thermal post-treatment with an addition of element VI, wherein step a) comprises the following operations:
  a1) depositing a multilayer structure comprising at least:
   two layers of element I and
   two layers of element III,
  in at least one alternating sequence of the layers I/III/I/III or III/I/III/I, and
  a2) annealing this structure before adding element VI to obtain a layer of I-III alloy.

2. Method according to claim 1, wherein the thin film with photovoltaic properties is based on a $CuIn(S,Se)_2$ alloy, and wherein the multilayer structure of operation a1) comprises an atomic ratio for the Cu/In of between 1.2 and 2.0.

3. Method according to claim 2, wherein the thin film with photovoltaic properties is based on a $Cu(In,Ga)(S,Se)_2$ alloy, and wherein the multilayer structure of operation a1) comprises:
 an atomic ratio for the Cu/(In+Ga) of between 0.8 and 1.0, and
 an atomic ratio for the Ga/(In+Ga) of between 0.1 and 0.4.

4. Method according to claim 1, wherein the total thickness of the structure is between 1 and 3 μm, after element VI is added.

5. Method according to claim 1, comprising dissimilar deposition conditions for at least two layers of the same element.

6. Method according to claim 5, wherein the second layer of element I is deposited at a higher electrode potential, as an absolute value, than the deposition potential of the first layer of element I.

7. Method according to claim 1, wherein operation a2) comprises an increase to an alloying temperature of between 100 and 250° C. for a period of between 5 and 120 minutes.

8. Method according to claim 7, wherein the increase in temperature is followed by a return to room temperature during a period of between 20 and 180 seconds in order to quench the I-III alloy before adding element VI.

9. Method according to claim 7, wherein the I-III alloy is maintained at alloying temperature before element VI is added.

10. Method according to claim 1, wherein the addition of element VI comprises a second heat treatment in an atmosphere of element VI with a temperature increase to between 450 and 600° C., then maintaining it at this temperature for a period of between 30 and 600 seconds.

11. Method according to claim 1, wherein the addition of element VI comprises:
 a condensation of vapors containing element VI at a temperature of the I-III alloy of less than 100° C.,
 followed by a temperature increase to between 150 and 250° C. maintained for 30 seconds to 15 minutes,
 followed by a temperature increase to 450 to 550° C. for 30 seconds to 15 minutes.

12. Method according to claim 11, wherein the element VI comprises selenium.

13. Method according to claim 1, wherein the multilayer structure terminates at the surface in a layer of element I.

14. Thin film having photovoltaic properties, based on a I-III-VI$_2$ alloy and obtained by the method according to claim 1, wherein the layer comprises an alternating variation in the alloy proportion of element I and element III.

15. Method for producing a solar cell, wherein it comprises the method for producing a thin film of photovoltaic properties according to claim 1.

* * * * *